(12) United States Patent
Kelkar et al.

(10) Patent No.: US 7,532,040 B1
(45) Date of Patent: May 12, 2009

(54) PROGRAMMABLE SENSITIVITY FREQUENCY COINCIDENCE DETECTION CIRCUIT AND METHOD

(75) Inventors: Ram Kelkar, South Burlington, VT (US); Grant P. Kesselring, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 11/928,080

(22) Filed: Oct. 30, 2007

(51) Int. Cl.
*G01R 23/02* (2006.01)
(52) U.S. Cl. .......................................... 327/48; 327/40
(58) Field of Classification Search ................. None
See application file for complete search history.

(56) References Cited

U.S. PATENT DOCUMENTS

| | | | |
|---|---|---|---|
| 4,628,282 A * | 12/1986 | Hikawa et al. | 331/1 A |
| 4,672,329 A * | 6/1987 | Hikawa | 331/1 A |
| 5,525,932 A | 6/1996 | Kelkar et al. | |
| 5,656,977 A | 8/1997 | Kelkar et al. | |
| 5,680,076 A | 10/1997 | Kelkar et al. | |
| 6,956,441 B2 * | 10/2005 | Matsumaru et al. | 331/1 A |
| 6,970,047 B1 | 11/2005 | Johnson et al. | |
| 2002/0180540 A1 * | 12/2002 | Hirai | 331/100 |
| 2003/0016058 A1 * | 1/2003 | Kakiuchi | 327/46 |
| 2003/0179024 A1 * | 9/2003 | Montagnana | 327/156 |

* cited by examiner

*Primary Examiner*—Cassandra Cox
(74) *Attorney, Agent, or Firm*—Downs Rachlin Martin PLLC (57) ABSTRACT

A frequency coincidence detection circuit for detecting frequency edges for each of a plurality of periodic digital signals. The circuit generates count indicators for each of the periodic digital signals and compares each of the count indicators to a programmable sensitivity input to determine a coincidence window for the corresponding one of each of the periodic digital signals. The circuit determines a signal coincidence of the coincidence windows. In another embodiment, a frequency coincidence detection method is provided. The method detects frequency edges for each of a plurality of periodic digital signals, generates count indicators for each of the periodic digital signals and compares each of the count indicators to a programmable sensitivity input to determine a coincidence window for the corresponding one of each of the periodic digital signals. The method determines a signal coincidence of the coincidence windows.

19 Claims, 9 Drawing Sheets

Sequence table 300

| Cycle No | SEL[0:4] | Frequency Sensitivity (S) in Max % Freq Delta |
|---|---|---|
| 32 | 01111 | 101.6 |
| 31 | 00111 | 98.4 |
| 30 | 10011 | 95.3 |
| 29 | 01111 | 92.2 |
| 28 | 10011 | 89.1 |
| 27 | 11001 | 85.9 |
| 26 | 01100 | 82.8 |
| 25 | 10110 | 79.7 |
| 24 | 01011 | 76.6 |
| 23 | 00101 | 73.4 |
| 22 | 10010 | 70.3 |
| 21 | 01001 | 67.2 |
| 20 | 00100 | 64.1 |
| 19 | 00010 | 60.9 |
| 18 | 00001 | 57.8 |
| 17 | 10000 | 54.7 |
| 16 | 01000 | 51.6 |
| 15 | 10100 | 48.4 |
| 14 | 01010 | 45.3 |
| 13 | 10101 | 42.2 |
| 12 | 11010 | 39.1 |
| 11 | 11101 | 35.9 |
| 10 | 01110 | 32.8 |
| 9 | 10111 | 29.7 |
| 8 | 11011 | 26.6 |
| 7 | 01101 | 23.4 |
| 6 | 00110 | 20.3 |
| 5 | 00011 | 17.2 |
| 4 | 10001 | 14.1 |
| 3 | 11000 | 10.9 |
| 2 | 11100 | 7.8 |
| 1 | 11110 | 4.7 |
| 0 | 11111 | 1.6 |

PROGRAMMABLE SENSITIVITY FREQUENCY COINCIDENCE DETECTION CIRCUIT AND METHOD

FIELD OF THE DISCLOSURE

The present disclosure generally relates to the field of frequency lock indicators. In particular, the present disclosure is directed to a programmable sensitivity frequency coincidence detection circuit and method.

BACKGROUND

In certain circuit applications wherein two clocks need to be tracked, a "frequency lock indicator" may be required. A frequency lock indicator may be activated when it is determined that two clock signals are the same frequency, within a certain tolerance. One example application that requires a frequency lock indicator is a phase-locked loop (PLL) application. A PLL is set up to operate in a certain frequency range and a typical PLL compares a reference clock to a feedback clock via a phase-frequency detector. If the feedback clock is, for example, too slow, the frequency of the feedback clock is increased until the two clocks are of equal phase and frequency and the PLL is considered locked. A lock indicator, such as the output of a phase-frequency detector, provides a mechanism for indicating when the PLL is locked.

A problem with, for example, current PLL lock indicators is that each PLL is designed for a certain amount of jitter tolerance for operating at high speed in the field and the sensitivity of the lock indicator is fixed accordingly. However, during, for example, manufacturing test operations, the PLL may be running at a low speed, but with the same fixed jitter sensitivity as when running at high speed and, thus, during test operations the PLL may continuously become unlocked. Therefore, during test the use of the PLL lock indicator directly may not be reliable. Consequently, it may be beneficial to develop improved methods of generating frequency lock indicators for PLL and other applications.

SUMMARY OF THE DISCLOSURE

In one embodiment, a frequency coincidence detection circuit is provided. The circuit includes a first counter driven by a first periodic signal for counting one or more frequency edges of the first periodic signal and outputting a first frequency count signal representative of at least a portion of the contents of the first counter; a second counter driven by a second periodic signal for counting one or more frequency edges of the second periodic signal and outputting a second frequency count signal representative of at least a portion of the contents of the second counter; a first frequency sensitivity programmer electrically connected to the first counter and a first programmable sensitivity value input for comparing the first frequency count signal with the sensitivity value input to determine a first coincidence window signal for the first periodic signal; a second frequency sensitivity programmer electrically connected to the second counter and the first sensitivity value input for comparing the second frequency count signal with the sensitivity value input to determine a second coincidence window signal for the second periodic signal; and a coincidence detector electrically connected to the first and second frequency sensitivity programmers for outputting a coincidence pulse when the first and second coincidence window signals correspond.

In yet another embodiment, a frequency coincidence of a plurality of periodic digital signals is provided. The signal includes detecting a plurality of frequency edges for each of a plurality of periodic digital signals; generating a plurality of count indicators for each of the plurality of periodic digital signals, each count indicator representing the detection of a frequency edge and including a unique identifier such that each unique identifier represents one cycle of an interval of cycles from a first cycle to a terminal cycle; comparing each of the plurality of count indicators to a programmable sensitivity input to determine a coincidence window for the corresponding one of each of the plurality of periodic digital signals; determining a signal coincidence of the coincidence windows for each of the plurality of periodic digital signals; and generating a frequency coincidence pulse signal based on the signal coincidence.

In yet still another embodiment, a frequency coincidence detection circuit is provided. The circuit includes a means for detecting a plurality of frequency edges for each of a plurality of periodic digital signals; means for generating a plurality of count indicators for each of the plurality of periodic digital signals, each count indicator representing the detection of a frequency edge and including a unique identifier such that each unique identifier represents one cycle of an interval of cycles from a first cycle to a terminal cycle; means for comparing each of the plurality of count indicators to a programmable sensitivity input to determine a coincidence window for the corresponding one of each of the plurality of periodic digital signals; means for determining a signal coincidence of the coincidence windows for each of the plurality of periodic digital signals; and means for generating a frequency coincidence pulse signal based on the signal coincidence.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

In one embodiment, the present disclosure includes a frequency coincidence detection circuit that has programmable frequency sensitivity. In one example, a frequency coincidence detection circuit is provided that includes a first clock that drives a first counter that is connected to a first frequency sensitivity programmer that has a sensitivity program value for comparing the frequency of the first clock therewith, in order to determine a first coincidence window. Additionally, the frequency coincidence detection circuit includes a second clock that drives a second counter that is connected to a second frequency sensitivity programmer that has a sensitivity program value for comparing the frequency of the second clock therewith, in order to determine a second coincidence window. Additionally, the frequency coincidence detection circuit includes a coincidence detector for providing a coincidence pulse when the first and second coincidence windows correspond.

Figure 1:
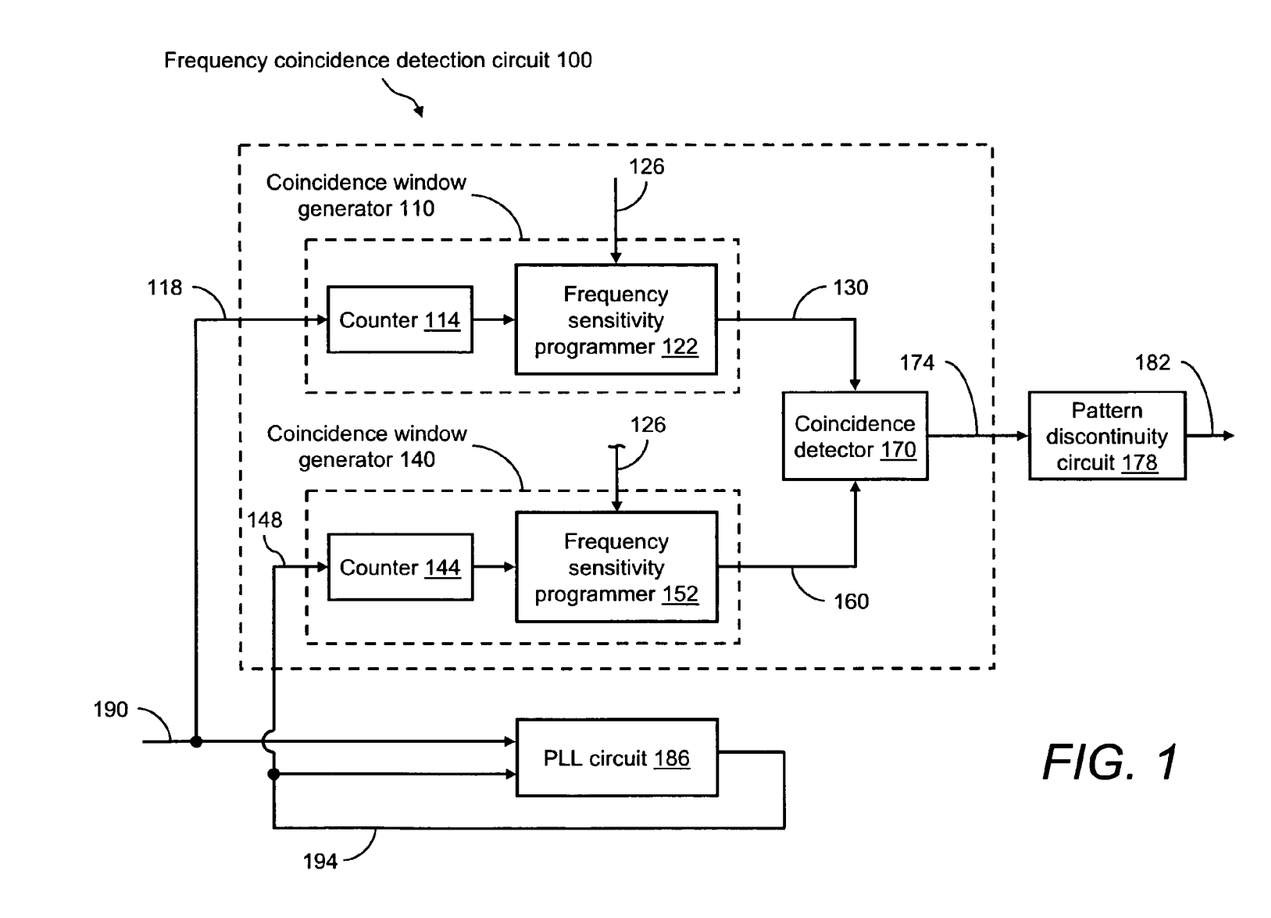
FIG. 1 illustrates a block diagram of an example of a frequency coincidence detection circuit.

FIG. 1 illustrates a block diagram of an example of a frequency coincidence detection circuit 100. Frequency coincidence detection circuit 100 includes at least two coincidence window generators. In one example, frequency coincidence detection circuit 100 includes a first coincidence window generator 110 and a second coincidence window generator 140. First coincidence window generator 110 further includes a counter 114, which is driven by a first periodic signal 118 (e.g., a first clock), that is electrically connected to a frequency sensitivity programmer 122. Frequency sensitivity programmer 122 has a programmable sensitivity value input 126 and generates a coincidence window signal 130, the timing of which is directly related to the frequency of first periodic signal 118. Additionally, second coincidence window generator 140 further includes a counter 144, which is driven by a second periodic signal 148 (e.g., a second clock), that is electrically connected to a frequency sensitivity programmer 152. Frequency sensitivity programmer 152 generates a coincidence window signal 160, the timing of which is directly related to the frequency of second periodic signal 148. In one example, programmable sensitivity value input 126 is common to both frequency sensitivity programmer 122 and frequency sensitivity programmer 152. In another example, programmable sensitivity value input 126 is different for each of frequency sensitivity programmer 122 and frequency sensitivity programmer 152.

Coincidence window signal 130 of frequency sensitivity programmer 122 and coincidence window signal 160 of frequency sensitivity programmer 152 feed the inputs of a coincidence detector 170 of frequency coincidence detection circuit 100. Coincidence detector 170 produces a coincidence pulse 174 when coincidence window signal 130 and coincidence window signal 160 correspond (e.g., overlap in time).

Counters 114 and 144 may each be any counter, such as, but not limited to, a counter that counts clock edges. In one example, a counter (e.g., counters 114 and 144) may be a binary counter of any bit width. In another example, a counter may be a linear feedback shift register (LFSR) that is acting as counter of any bit width. In one such example, an LFSR is an n-bit shift register, which pseudo-randomly scrolls between $2^n-1$ values, but does so very quickly because there is minimal combinational logic involved. Once this exemplary LFSR reaches its final state, it will execute the sequence exactly as before. In another example, counters 114 and 144 may each be any 5-bit counter that is capable of counting 32 events, such as counting 32 edges of first periodic signal 118 and second periodic signal 148.

The number of bits forming programmable sensitivity value input 126 may correlate to the bit count of counters 114 and 144, respectively. Bit for bit, the states of programmable sensitivity value input 126 may be compared to the states of the output bits of counters 114 and 144, respectively. In doing so, frequency sensitivity programmer 122 generates coincidence window signal 130 and frequency sensitivity programmer 152 generates coincidence window signal 160. When coincidence window signal 130 and coincidence window signal 160 overlap in time coincidence detector 170 produces coincidence pulse 174. In one exemplary aspect, a coincidence pulse (e.g., coincidence pulse 174) may indicate that first periodic signal 118 and second periodic signal 148 are satisfactorily close in frequency within the programmed frequency sensitivity as selected via programmable sensitivity value input 126. More details of an example frequency sensitivity programmer, such as frequency sensitivity programmers 122 and 152, are described with reference to FIGS. 2, 3, and 4.

In operation, frequency coincidence detection circuit 100 compares the frequencies of first periodic signal 118 and second periodic signal 148 and provides an indicator (e.g., coincidence pulse 174) as to when the two signals have substantially the same frequency. The frequencies of the two signals are compared by use of counters 114 and 144 that may reset each other when a consecutive number of equal frequencies from the two signals do not occur concurrently. However, when a consecutive number of equal frequencies occurs, coincidence pulse 174 may be generated, which indicates that first periodic signal 118 has substantially the same frequency as second periodic signal 148, regardless of whether the phases are equal. Coincidence pulse 174 may be generated by detecting the coincidence of the output of counters 114 and 144. The tolerance to the difference between the frequencies of first periodic signal 118 and second periodic signal 148 may be made programmable by making the pulse width of coincidence window signals 130 and 160 of first coincidence window generators 110 and 140, respectively, programmable via programmable sensitivity value input 126.

In one embodiment, the pulse width of coincidence window signals 130 and 160 are programmable based on programmable sensitivity value input 126. Coincidence detector 170 generates coincidence pulse 174 when counters 114 and 144 have been essentially equal for a certain consecutive number of times, which indicates that first periodic signal 118 has substantially the same frequency as second periodic signal 148. In one example, substantially the same frequency is determined when phases are equal. In another example, substantially the same frequency is determined when phases are not equal. The time at which coincidence window signals 130 and 160 are generated may be a function of counters 114 and 144, respectively, and the amount of time that it takes for counters 114 and 144 to sequence from a starting count to an ending count is a function of the frequency of first periodic signal 118 and second periodic signal 148, respectively. Consequently, the occurrence of coincidence window signals 130 and 160 is a function of the frequency of first periodic signal 118 and second periodic signal 148, respectively. More details of the operation of a frequency coincidence detection circuit, such as frequency coincidence detection circuit 100, are described with reference to FIGS. 2 through 5D.

A frequency coincidence detection circuit, such as frequency coincidence detection circuit 100, may be used, for example, but not limited to, in any PLL application and in any application or circuit wherein two periodic signals need to be tracked and wherein programmability may be desired. By way of example, FIG. 1 shows frequency coincidence detection circuit 100 that is utilized in the context of a PLL circuit 186.

Referring again to FIG. 1, a reference clock 190 of PLL circuit 186 may be connected to first periodic signal 118 that feeds counter 114 of first coincidence window generator 110 and a feedback clock 194 of PLL circuit 186 may be connected to second periodic signal 148 that feeds counter 144 of second coincidence window generator 140. Frequency coincidence detection circuit 100 may be used in combination with PLL circuit 186 in order to generate, for example, a PLL lock indicator. In one example, coincidence pulse 174 of coincidence detector 170 of frequency coincidence detection circuit 100 feeds a pattern discontinuity circuit 178 that produces a frequency lock signal 182, as shown in FIG. 1. For example, frequency lock signal 182 may be a logic high when first periodic signal 118 and second periodic signal 148 have substantially the same frequency within the programmed sensitivity value. Alternatively, frequency lock signal 182 may be a logic low when first periodic signal 118 and second periodic signal 148 do not have substantially the same frequency within the programmed sensitivity value. In this example, frequency lock signal 182 may be monitored by any logic function for any purpose.

Figure 2:
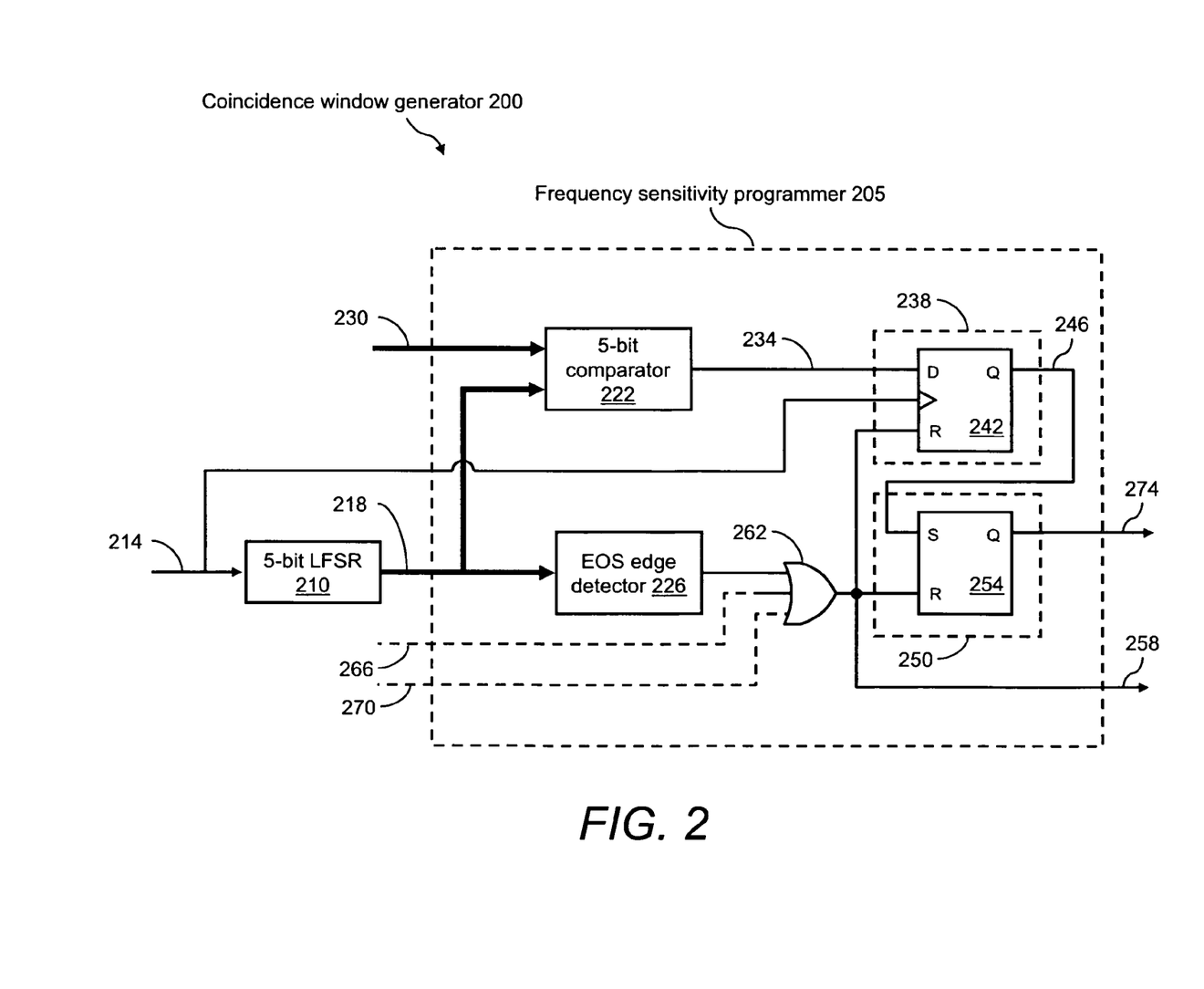
FIG. 2 illustrates a block diagram of an example of a coincidence window generator that includes an example of a frequency sensitivity programmer.

FIG. 2 illustrates a block diagram of an example of a coincidence window generator 200 that includes an example of a frequency sensitivity programmer 205. Coincidence window generator 200 includes a 5-bit LFSR 210 that acts as a counter, which is one example of counter 114 of FIG. 1. 5-bit LFSR 210 is clocked by a periodic signal 214 and provides a 5-bit output 218 that feeds a first input of a 5-bit comparator 222 and an input of an end-of-cycle (EOS) edge detector 226 of frequency sensitivity programmer 205. It is noted that although this example utilizes a 5-bit LFSR and a 5-bit comparator, the number of bits may be different in other implementations of a coincidence window generator (e.g., coincidence window generator 200). A second input of 5-bit comparator 222 may be a 5-bit programmable sensitivity value input 230, the value of which may be user selected. An output 234 of 5-bit comparator 222 is active when 5-bit output 218 of 5-bit LFSR 210 is bit-for-bit equivalent to 5-bit programmable sensitivity value input 230. Output 234 of 5-bit comparator 222 feeds a glitch prevent circuit 238, which, in one example, may be instantiated as a negative edge triggered D-latch 242 (e.g., output 234 is connected to the D input thereof) that may be clocked by periodic signal 214. An output 246 of D-latch 242 feeds an input of a signal value holding circuit 250, which, in one example, may be instantiated as a set/reset latch 254 (e.g., output 246 of D-latch 242 is connected to the set input thereof). Glitch prevent circuit 238 may be optional. Alternatively, in another example, output 234 of 5-bit comparator 222 may be connected directly to the set input of set/reset latch 254.

The reset input of set/reset latch 254 may be connected to a reset signal 258 from an OR gate 262. One input of OR gate 262 may be an output of EOS edge detector 226. In another example, another input 266 of OR gate 262 may originate from another instance of a frequency sensitivity programmer (e.g., an output of an equivalent EOS edge detector of a frequency sensitivity programmer connected to another counter of a frequency coincidence detector circuit (e.g., circuit 100)). Optionally, another input of OR gate 262 may be a global system reset signal 270. EOS edge detector 226 may be a device that generates a pulse when 5-bit LFSR 210 rolls over from a maximum count to zero, e.g., when all bits of 5-bit output 218 transition from all ones to any other value. The amount of time that it takes for 5-bit LFSR 210 to sequence from a starting value to its ending value (e.g., its EOS) is a function of the frequency of its clock, such as periodic signal 214. More details of the operation of coincidence window generator 200 are described with reference to FIGS. 3 and 4.

Figure 3:
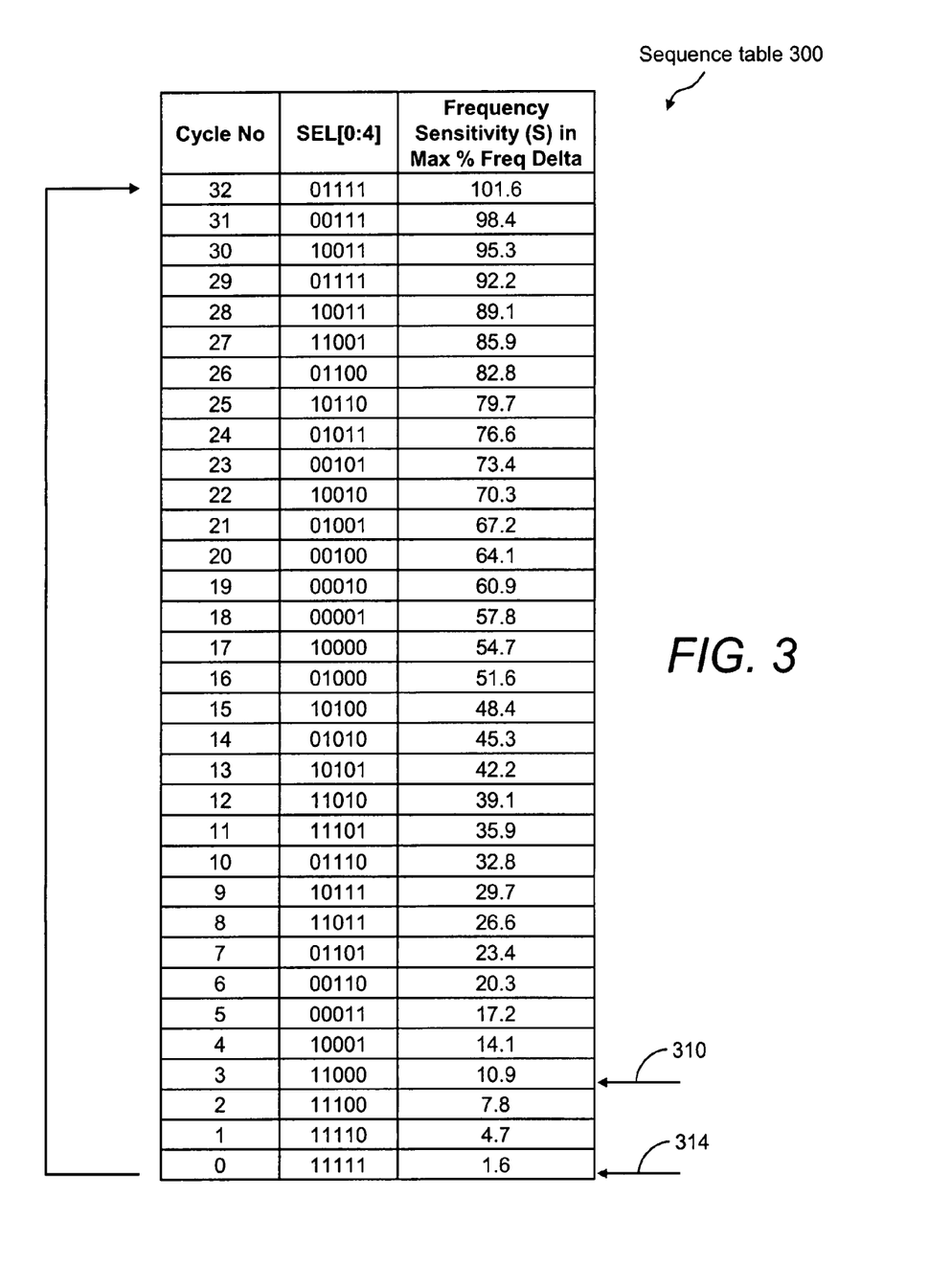
FIG. 3 illustrates a table of an example operation sequence of a frequency coincidence detection circuit.

FIG. 3 illustrates a table 300 of an example operation sequence of a frequency coincidence detection circuit that includes, for example, a 5-bit LFSR acting as a counter, such as 5-bit LFSR 210 of FIG. 2, which may be configured for a maximal-length sequence of 32. In one embodiment, the 5-bit LFSR may have a sequence that is described by table 300. Table 300 is exemplary and it is contemplated that variants of an operation sequence for 5-bit and other bit and/or circuit configurations will be clear from the disclosure herein.

Referring again to FIGS. 2 and 3, 5-bit output 218 of 5-bit LFSR 210 of FIG. 2 cycles through the sequence shown in table 300. Transition from one state to the next may occur on the rising edge of periodic signal 214. In real time, 5-bit output 218 of 5-bit LFSR 210 may be compared, bit-for-bit, with 5-bit programmable sensitivity value input 230 via 5-bit comparator 222. When 5-bit output 218 of 5-bit LFSR 210 matches 5-bit programmable sensitivity value input 230, D-latch 242 stores a logic high value at the next falling edge of periodic signal 214. The purpose of the negative edge triggered D-latch 242 is to allow 5-bit comparator 222 adequate time to compare, while avoiding propagating any glitches. Set/reset latch 254 is then set, which causes its output (e.g., a coincidence window signal 274) to go high. A value for a programmable sensitivity value (e.g., value input 230) may be selected in conjunction with an operation sequence (e.g., that of Table 300) to give a desired sensitivity to a frequency coincidence detection circuit.

In the example of FIG. 2, EOS edge detector 226 monitors the contents of 5-bit output 218 of 5-bit LFSR 210 to detect the end of the sequence (i.e. 11111, cycle 0 of table 300). More specifically, using EOS edge detector 226, the precise moment when the sequence of 5-bit output 218 of 5-bit LFSR 210 rolls over from 11111 back to 01111 is captured and used to reset set/reset latch 254, which causes its output (e.g., coincidence window signal 274) to go low. A set of waveforms that illustrate the operation of coincidence window generator 200 are described with reference to FIG. 4.

Figure 4:
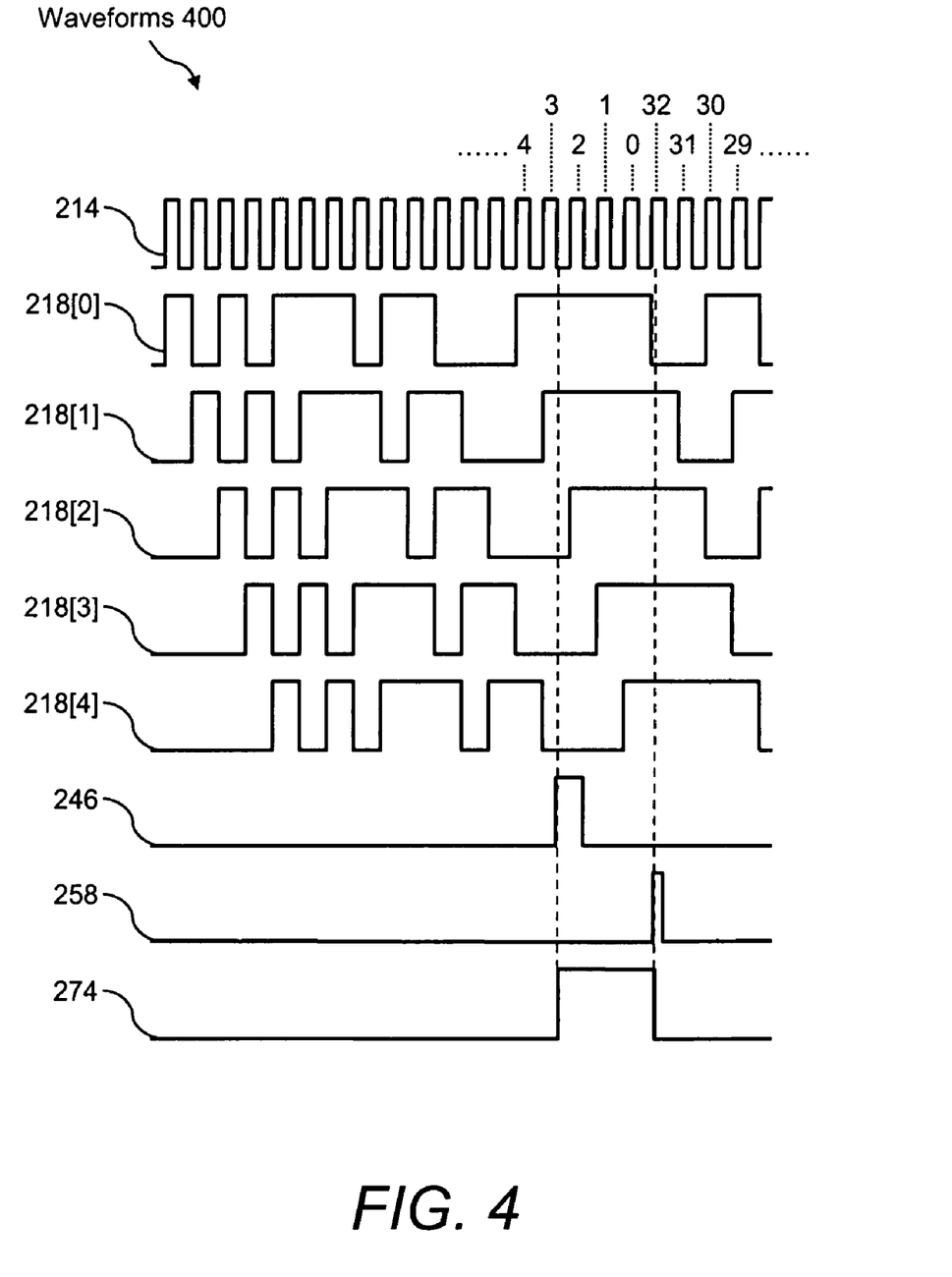
FIG. 4 illustrates a set of waveforms that illustrate the operation of an example coincidence window generator.

FIG. 4 illustrates a set of waveforms 400 that illustrate the operation of an example coincidence window generator, such as coincidence window generator 200 of FIG. 2. In particular, waveforms 400 illustrate an example wherein 5-bit programmable sensitivity value input 230 (e.g., the first bit (230[0]), the second bit (230[1]), the third bit (230[2]), the fourth bit (230[3]), and the fifth bit (230[4]) are programmed to a value of 11000, respectively) and the operations resulting therefrom. A first waveform illustrates an exemplary periodic signal 214, a next set of waveforms illustrate an exemplary 5-bit output 218[0], 218[1], 218[2], 218[3], and 218[4], respectively, of 5-bit LFSR 210, a next waveform illustrates an exemplary output 246 of D-latch 242 that sets set/reset latch 254, a next waveform illustrates an exemplary reset signal 258 that originates from EOS edge detector 226 that resets set/reset latch 254, and a next waveform illustrates an exemplary coincidence window signal 274, which is the output of set/reset latch 254.

In this example, 5-bit programmable sensitivity value input 230 (e.g., 230 bits [0:4]) is programmed to a value of 11000 which causes the output of 5-bit comparator 222 to be activated at cycle number 3 of periodic signal 214 (see table 300, marker 310), which generates a pulse at output 246 of D-latch 242 at the next falling edge of periodic signal 214, as shown in waveforms 400, which sets coincidence window signal 274 to a high, also shown in waveforms 400. When cycle number 0 of periodic signal 214 is reached (see table 300, marker 314), reset signal 258 from EOS edge detector 226 is generated, as shown in waveforms 400, which resets coincidence window signal 274 to a low, also shown in waveforms 400. Consequently, the width of coincidence window signal 274, which may be compared to another instance of a coincidence window signal at, for example, coincidence detector 170 of FIG. 1, may be determined by the programmed value of 5-bit programmable sensitivity value input 230, which essentially slides marker 310 of table 300 toward cycle 32 or toward cycle 0. In doing so, the sensitivity of frequency sensitivity programmer 205, as shown in frequency sensitivity (S) column of table 300 of FIG. 3, can be selected. Although the discussion herein may refer to a logical high as coincidence window signal active, it is also contemplated that a logical low may represent a coincidence window signal active.

Referring again to table 300 of FIG. 3, the frequency sensitivity (S) may be calculated for a LFSR acting as a counter, as follows.

$$S = f_{REF}((N+0.5)/M);\text{ where}$$

S=frequency sensitivity, i.e., how closely the two clock frequencies are matched;
$f_{REF}$=frequency of a reference clock signal;
M=LFSR max sequence length, e.g., determined by the number of bits in the LFSR, which is designer defined;
N=cycle number, e.g., cycle number 3 of table 300 of FIG. 3 corresponds to a program value of 111000).

In one example, for a 5-bit LFSR and a program value of 11000 (see table 300 of FIG. 3) and a 1 gigahertz (GHz) reference clock:

$M=2^5=32$, N=3 (for a programmable sensitivity value input of 11000), and $f_{REF}=1$ GHz:
S=1 GHz $((3+0.5)/2^5)=\pm 0.109$ GHz, or S may be expressed as $\pm 10.9\%$ of $f_{REF}$. In this example and referring again to FIG. 1, if first periodic signal 118 is the 1 GHz reference clock, coincidence detector 170 generates coincidence pulse 174 as long as the frequency of second periodic signal 148=1 GHz ±10.9%.

A user may control the pulse width of coincidence window signal 274 by changing 5-bit programmable sensitivity value input 230. Selecting bits near the top of table 300 of FIG. 3 results in a large pulse width, while selecting bits near the bottom of table 300 produces a smaller pulse width. The pulse width of coincidence window signal 274 is related to the maximum difference in frequency tolerated by the lock indicator according to the formula above.

Figure 5A:
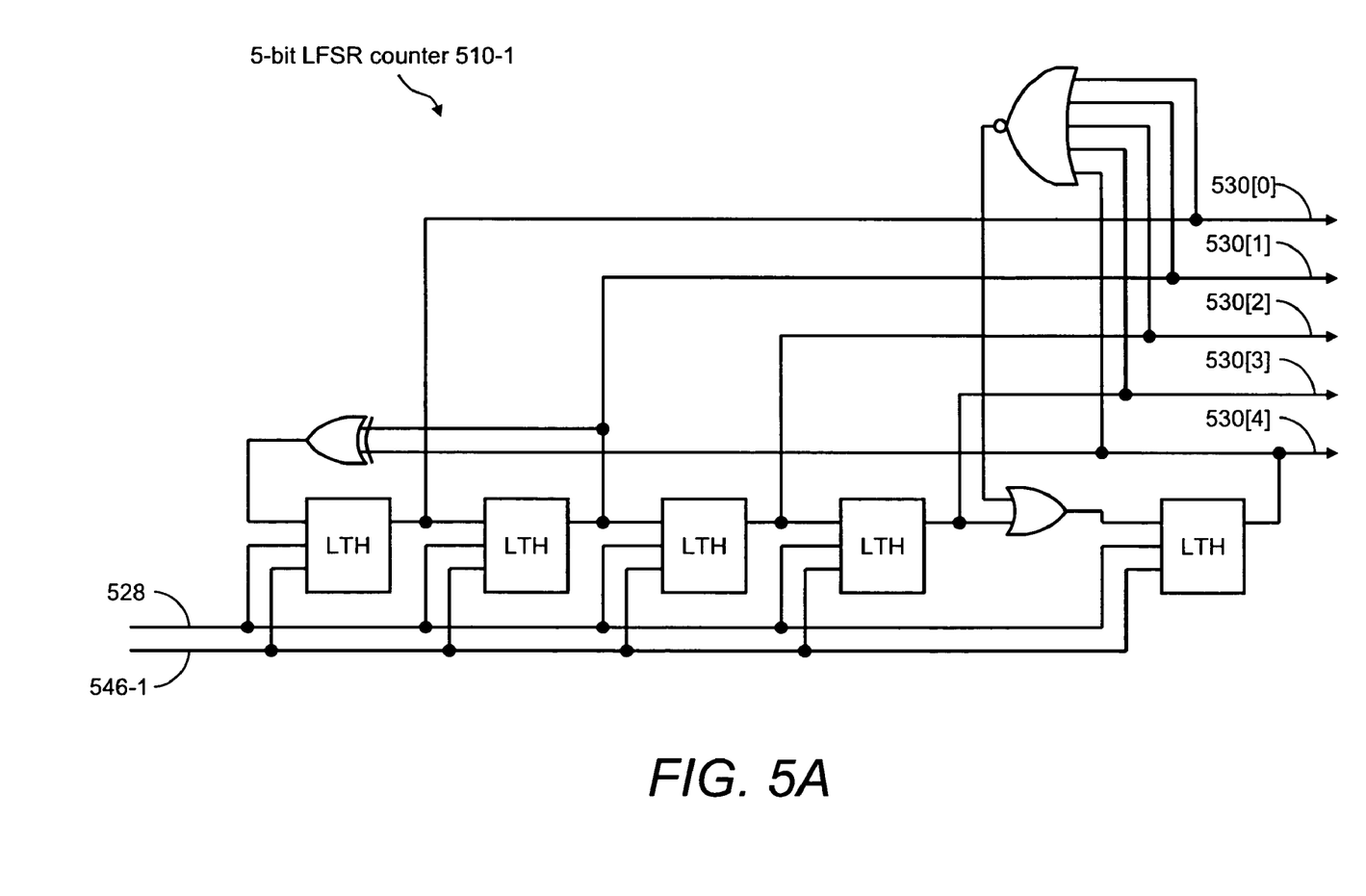
FIGS. 5A, 5B, 5C, and 5D illustrate a schematic diagram of an example frequency coincidence detection circuit.
Figure 5B:
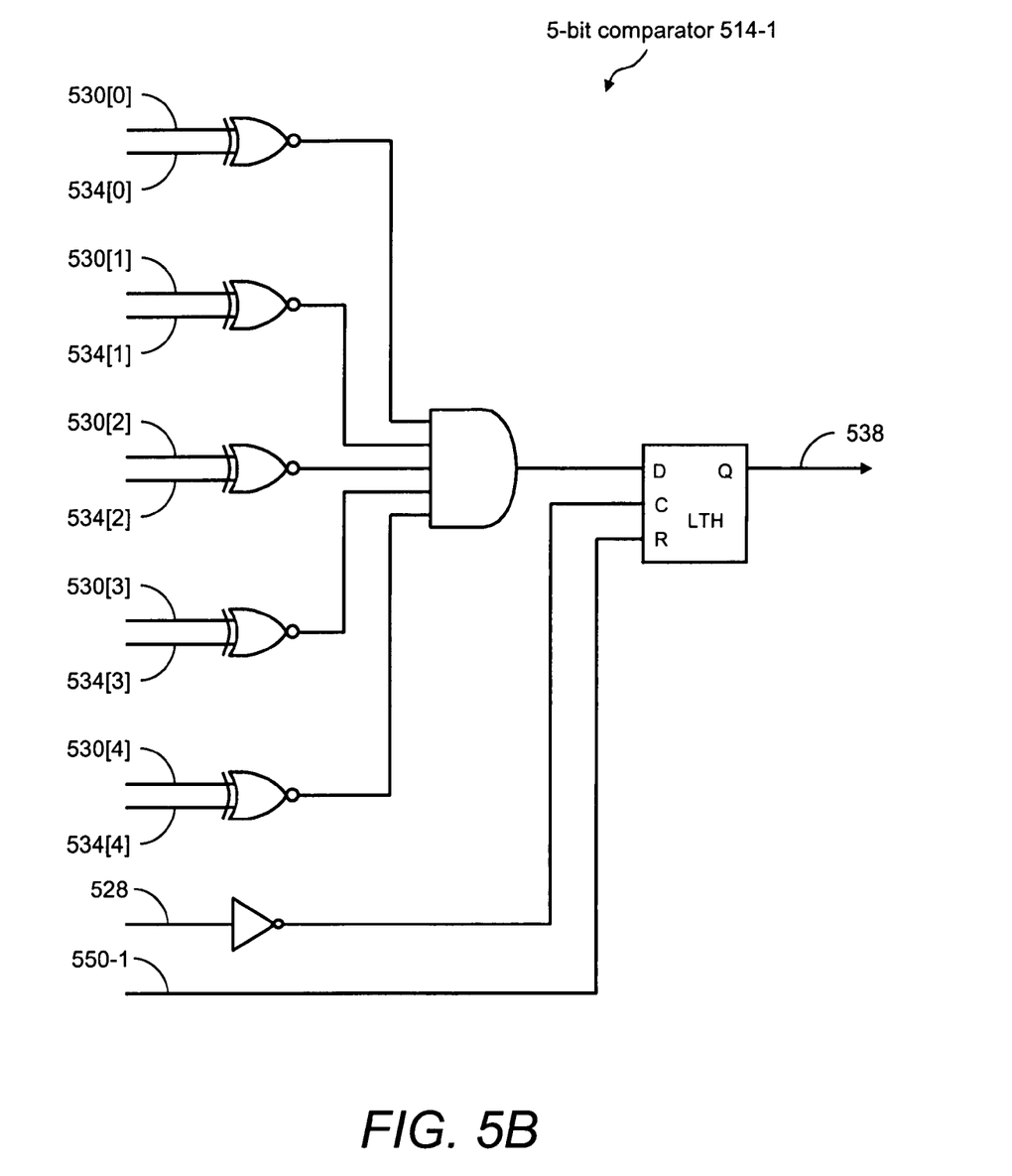
Figure 5C:
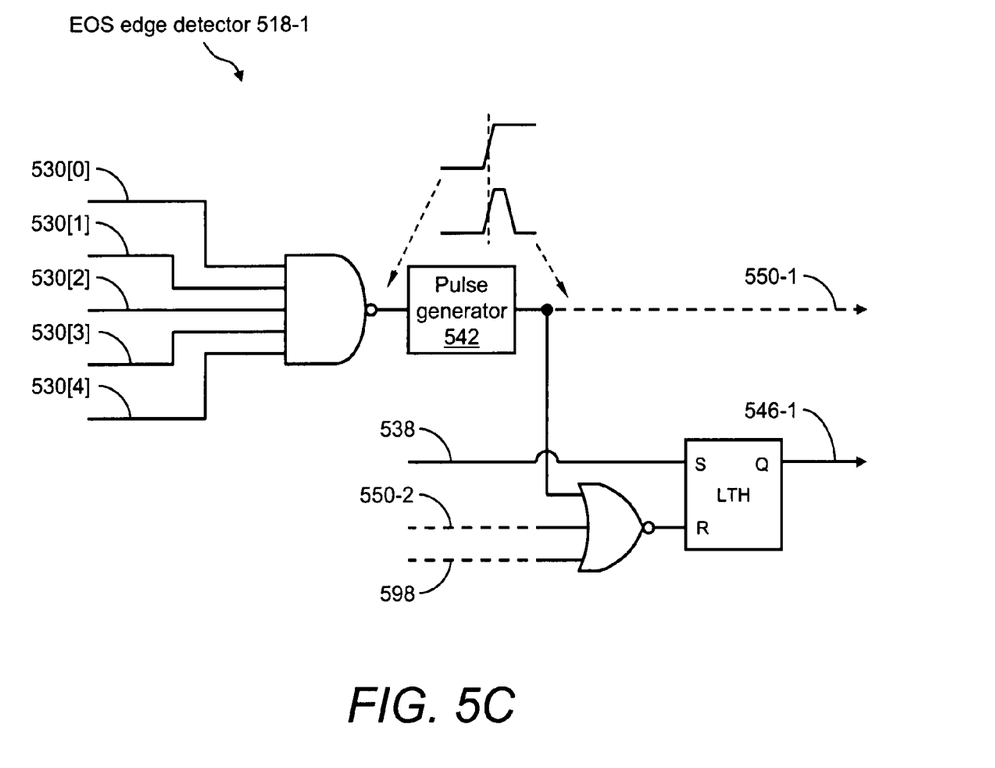
Figure 5D:
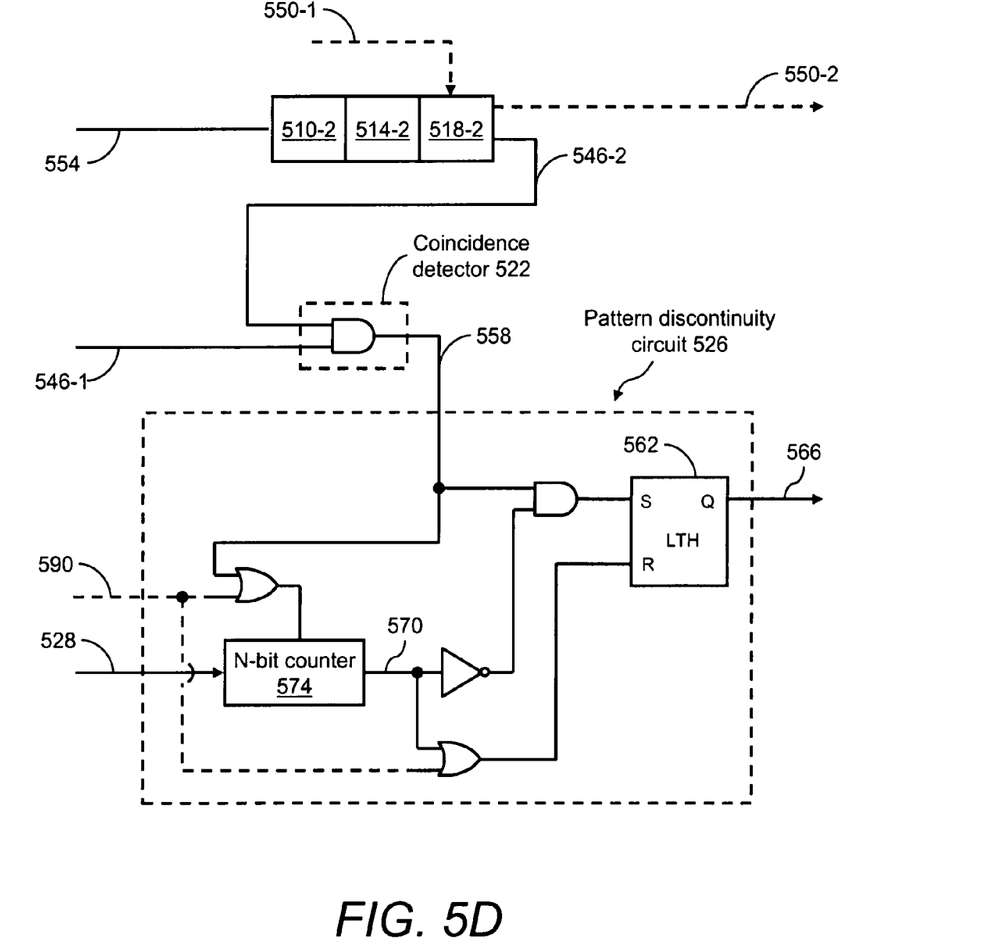

FIGS. 5A, 5B, 5C, and 5D illustrate a schematic diagram of an example frequency coincidence detection circuit 500. More specifically, FIG. 5A illustrates a schematic diagram of an example 5-bit LFSR counter 510-1, which is a portion of the example frequency coincidence detection circuit 500. FIG. 5B illustrates a schematic diagram of an example 5-bit comparator 514-1, which is another portion of the example frequency coincidence detection circuit 500. FIG. 5C illustrates a schematic diagram of an example EOS edge detector 518-1, which is yet another portion of the example frequency coincidence detection circuit 500. FIG. 5D illustrates a schematic diagram of an example coincidence detector 522 and an example pattern discontinuity circuit 526, which is still yet another portion of the example frequency coincidence detection circuit 500.

FIG. 5A shows 5-bit LFSR counter 510-1, which may be a first instance of at least two LFSR counters of frequency coincidence detection circuit 500. 5-bit LFSR counter 510-1 may be clocked by a first periodic signal 528 and may be reset via a first crossover reset signal 550-1 from EOS edge detector 518-1 of FIG. 5C. 5-bit LFSR counter 510-1 generates LFSR outputs 530[0], 530[1], 530[2], 530[3], and 530[4] that are electrically connected to 5-bit comparator 514-1 of FIG. 5B and EOS edge detector 518-1 of FIG. 5C.

FIG. 5B shows 5-bit comparator 514-1, which may be a first instance of at least two comparators of frequency coincidence detection circuit 500. 5-bit comparator 514-1 compares LFSR outputs 530[0], 530[1], 530[2], 530[3], and 530[4] of 5-bit LFSR counter 510-1 of FIG. 5A to a set of programmable sensitivity value inputs 534[0], 534[1], 534[2], 534[3], and 534[4]. 5-bit comparator 514-1 may be clocked by first periodic signal 528 and reset via first crossover reset signal 550-1 from EOS edge detector 518-1 of FIG. 5C. 5-bit comparator 514-1 provides an output 538 to EOS edge detector 518-1 of FIG. 5C.

FIG. 5C shows EOS edge detector 518-1, which may be a first instance of at least two EOS edge detectors of frequency coincidence detection circuit 500. EOS edge detector 518-1 generates first crossover reset signal 550-1 when LFSR outputs 530[0], 530[1], 530[2], 530[3], and 530[4] of 5-bit LFSR counter 510-1 of FIG. 5A roll over from all ones to any other value. EOS edge detector 518-1 generates a coincidence window signal 546-1 that feeds coincidence detector 522 of FIG. 5D. Optionally, EOS edge detector 518-1 generates first reset signal 550-1 to another instance of an EOS edge detector, shown in FIG. 5D.

FIG. 5D shows that frequency coincidence detection circuit 500 may include a second instance of a LFSR counter, comparator, and EOS edge detector, such as a 5-bit LFSR counter 510-2, a 5-bit comparator 514-2, and an EOS edge detector 518-2 that are electrically interconnected substantially the same as 5-bit LFSR counter 510-1, 5-bit comparator 514-1, and EOS edge detector 518-1. Optionally, first crossover reset signal 550-1 from EOS edge detector 518-1 may feed EOS edge detector 518-2 and a second crossover reset signal 550-2 from EOS edge detector 518-2 may feed EOS edge detector 518-1. The combination of 5-bit LFSR counter 510-2, 5-bit comparator 514-2, and EOS edge detector 518-2 may be driven by a second periodic signal 554 and generates a coincidence window signal 546-2. In particular, FIG. 5D shows that coincidence window signal 546-1 from EOS edge detector 518-1 and coincidence window signal 546-2 from EOS edge detector 518-2 feed coincidence circuit 522, which may be, for example, but not limited to, an AND gate.

An output 558 of coincidence circuit 522 may be used to set a set/reset latch 562 within pattern discontinuity circuit 526. When a pulse occurs at output 558 of coincidence circuit 522, set/reset latch 562 generates a frequency lock signal 566, which indicates a frequency lock condition. However, output 558 of coincidence circuit 522 may be gated by a discontinuity signal 570, which may be generated by an N-bit counter 574. In one example, N-bit counter 574 may be any counter that has an equal or greater number of bits than, for example, 5-bit LFSR counter 510-1 and 510-2. In one example, N-bit counter 574 may be an 8-bit binary counter or an 8-bit LFSR that acts like a counter. N-bit counter 574 may be clocked by, for example, first periodic signal 528 or second periodic signal 554. N-bit counter 574 may be reset by the occurrence of output 558 of coincidence circuit 522. Therefore, in the absence of output 558 for a certain period of time that is greater than the timeout time of N-bit counter 574, N-bit counter 574 times out and discontinuity signal 570 resets set/reset latch 562 and, thus, resets frequency lock signal 566, which indicates a frequency unlock condition. By contrast, as long as the occurrence of output 558 of coincidence circuit 522 is more frequent than the timeout time of N-bit counter 574, frequency lock signal 566 is held active by set/reset latch 562.

Referring again to FIGS. 5A, 5B, 5C, and 5D, optionally, a global system reset signal 590 may be provided for setting various circuit elements of frequency coincidence detection circuit 500 to a known state.

Figure 6:
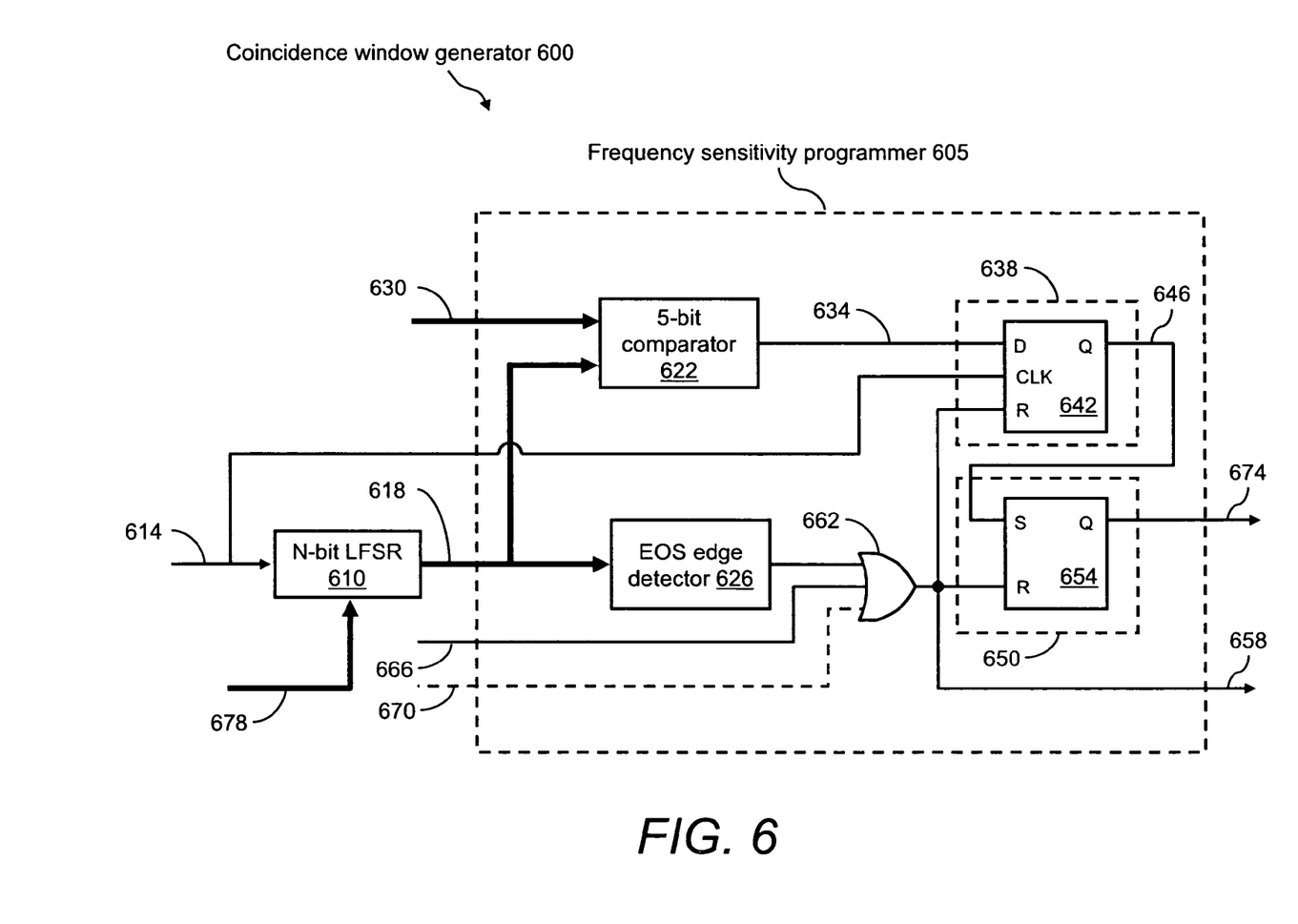
FIG. 6 illustrates a block diagram of another example of a coincidence window generator of a frequency coincidence detection circuit.

FIG. 6 illustrates a block diagram of another example of a coincidence window generator 600 of a frequency coincidence detection circuit. Coincidence window generator 600 of FIG. 6 may be substantially the same as coincidence window generator 200 of FIG. 2, except that another programmable sensitivity value input 678 at the counter element, such as an N-bit LFSR 610, is provided in combination with programmable sensitivity value input 630 at the bit compare element.

For added sensitivity programmability, programmable sensitivity value input 678 may be used to adjust the maximum sequence length of N-bit LFSR 610. Programmable sensitivity value input 678 becomes a "seed bit" that initializes N-bit LFSR 610 to any user-defined state. When N-bit LFSR 610 counts down to the end of sequence, N-bit LFSR 610 re-loads the seed and again establishes the maximum sequence length. In one example and referring again to table 300 of FIG. 3, if, for example, a user desires to adjust the maximum sequence length a 5-bit LFSR from 32 cycles to 16 cycles, the 5-bit LFSR may be seeded to start its sequence at, for example, cycle 16, then it counts down to cycle 0 (e.g., via 16 clocks) and then re-loads the seed to cycle 16 rather than to cycle 32. In this way, the maximum sequence length is adjusted from a possible 32 to 16. In similar fashion, a binary counter may be loaded to any start value and cycled to an ending count.

Therefore, added flexibility may be built into the circuit as described in the equation:

$S = f_{REF}((N+0.5)/M)$, where both M (set by programmable sensitivity value input 678) and N (set by programmable sensitivity value input 630) are variables that the user can control. In this way, precise frequency sensitivity may be engineered.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A frequency coincidence detection circuit comprising:
   a first counter driven by a first periodic signal for counting one or more frequency edges of said first periodic signal and outputting a first frequency count signal representative of at least a portion of the contents of said first counter;
   a second counter driven by a second periodic signal for counting one or more frequency edges of said second periodic signal and outputting a second frequency count signal representative of at least a portion of the contents of said second counter;
   a first frequency sensitivity programmer electrically connected to said first counter and a first programmable sensitivity value input for comparing said first frequency count signal with said sensitivity value input to determine a first coincidence window signal for said first periodic signal;
   a second frequency sensitivity programmer electrically connected to said second counter and the first sensitivity value input for comparing said second frequency count signal with said sensitivity value input to determine a second coincidence window signal for said second periodic signal; and
   a coincidence detector electrically connected to said first and second frequency sensitivity programmers for outputting a coincidence pulse when said first and second coincidence window signals correspond.

2. A circuit according to claim 1, further comprising:
   a pattern discontinuity circuit electrically connected to said coincidence detector for generating a frequency lock signal based on a predetermined number of occurrences of the coincidence pulse and generating a frequency unlock signal based on a predetermined amount of time of absence of the coincidence pulse.

3. A circuit according to claim 2, wherein said predetermined amount of time is determined by a number of cycles of said first periodic signal or said second periodic signal.

4. A circuit according to claim 1, wherein at least one of said first and second counters includes a linear feedback shift register.

5. A circuit according to claim 1, wherein said first frequency sensitivity programmer includes:
   a comparator circuit electronically connected to said first counter and the first sensitivity value input for determining when said first frequency count signal and the first sensitivity value input are the same and outputting a coincidence window start signal;
   a first signal value holding circuit electronically connected to said comparator circuit for receiving said coincidence window start signal and outputting said first coincidence window signal.

6. A circuit according to claim 5, wherein said first signal value holding circuit is a set/reset latch.

7. A circuit according to claim 5, further comprising a reset glitch prevent circuit electronically connected between said comparator circuit and said first signal value holding circuit for preventing a glitch in the coincidence window start signal due to a changing of state of said first counter.

8. A circuit according to claim 7, wherein said reset glitch prevent circuit includes a set/reset latch driven by said comparator circuit and at least one of said first and second periodic signals.

9. A circuit according to claim 1, wherein said first and second periodic signals are clock signals of an integrated circuit.

10. A circuit according to claim 5, further comprising an end-of-sequence detector in electrical communication with said first counter for determining when said first frequency count signal represents an end of a count sequence of said first counter, said end-of-sequence detector having an output electrically connected to said first counter and said first signal value holding circuit for resetting said first counter and said first signal value holding circuit upon said first counter reaching an end of a count sequence.

11. A circuit according to claim 10, wherein said output of said end-of-sequence detector is also electrically connected to said second counter for resetting said second counter upon said first counter reaching an end of a count sequence.

12. A circuit according to claim 1, further comprising:
   a second programmable sensitivity input in electrical connection with said first counter for providing an adjustment to at least one of said first and second counters for adjustably setting a bit length of the first frequency count signal.

13. A circuit according to claim 1, wherein said first and second counters each include a first number of register bits.

14. A method of determining a frequency coincidence of a plurality of periodic digital signals, the method comprising:
   detecting a plurality of frequency edges for each of a plurality of periodic digital signals;
   generating a plurality of count indicators for each of the plurality of periodic digital signals, each count indicator representing the detection of a frequency edge and including a unique identifier such that each unique identifier represents one cycle of an interval of cycles from a first cycle to a terminal cycle;
   comparing each of the plurality of count indicators to a programmable sensitivity input to determine a coincidence window for the corresponding one of each of the plurality of periodic digital signals;
   determining a signal coincidence of the coincidence windows for each of the plurality of periodic digital signals; and generating a frequency coincidence pulse signal based on the signal coincidence.

15. A method according to claim 14, further comprising:
determining a frequency lock signal as a function of said frequency coincidence pulse signal.

16. A method according to claim 14, wherein said programmable sensitivity input is determined by selecting a desired sensitivity value from a plurality of sensitivity values, each of the plurality of sensitivity values corresponding to one of the cycles of the interval of cycles.

17. A method according to claim 14, further comprising:
determining a width of the coincidence windows by selecting a desired sensitivity value from a plurality of sensitivity values, each of the plurality of sensitivity values corresponding to one of the cycles of the interval of cycles and arranged in an order from the first cycle to a terminal cycle, the width of the coincidence windows being a number of cycles including the cycle corresponding to the selected sensitivity value, the terminal cycle, and all cycle therebetween;
utilizing said selected sensitivity value as the programmable sensitivity input.

18. A method according to claim 14, further comprising tuning the size of the interval of cycles from a first number of cycles to a second number of cycles.

19. A frequency coincidence detection circuit comprising:
means for detecting a plurality of frequency edges for each of a plurality of periodic digital signals;
means for generating a plurality of count indicators for each of the plurality of periodic digital signals, each count indicator representing the detection of a frequency edge and including a unique identifier such that each unique identifier represents one cycle of an interval of cycles from a first cycle to a terminal cycle;
means for comparing each of the plurality of count indicators to a programmable sensitivity input to determine a coincidence window for the corresponding one of each of the plurality of periodic digital signals;
means for determining a signal coincidence of the coincidence windows for each of the plurality of periodic digital signals; and
means for generating a frequency coincidence pulse signal based on the signal coincidence.

* * * * *